(12) United States Patent
Oh et al.

(10) Patent No.: US 11,973,521 B2
(45) Date of Patent: Apr. 30, 2024

(54) ELECTRONIC DEVICE AND METHOD FOR PROCESSING HARMONIC SIGNAL

(71) Applicant: Samsung Electronics Co., Ltd., Gyeonggi-do (KR)

(72) Inventors: Kiyoung Oh, Gyeonggi-do (KR); Wonsang Lee, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 353 days.

(21) Appl. No.: 17/425,863

(22) PCT Filed: Jan. 23, 2020

(86) PCT No.: PCT/KR2020/001223
§ 371 (c)(1),
(2) Date: Jul. 26, 2021

(87) PCT Pub. No.: WO2020/153816
PCT Pub. Date: Jul. 30, 2020

(65) Prior Publication Data
US 2022/0029643 A1   Jan. 27, 2022

(30) Foreign Application Priority Data
Jan. 24, 2019 (KR) .......................... 10-2019-0009322

(51) Int. Cl.
*H04B 1/00*   (2006.01)
*H03F 3/24*   (2006.01)
*H04B 1/04*   (2006.01)

(52) U.S. Cl.
CPC ............. *H04B 1/005* (2013.01); *H03F 3/245* (2013.01); *H04B 1/04* (2013.01);
(Continued)

(58) Field of Classification Search
CPC .. H04B 1/005; H04B 1/04; H04B 2001/0408; H03F 3/245; H03F 2200/165; H03F 2200/294; H03F 2200/451
See application file for complete search history.

(56) References Cited

U.S. PATENT DOCUMENTS

| 7,671,693 B2 | 3/2010 | Brobston et al. |
| 9,054,653 B2 | 6/2015 | Gorbachov |

(Continued)

FOREIGN PATENT DOCUMENTS

| KR | 10-1309602 | 9/2013 |
| KR | 10-2014-0125808 | 10/2014 |

OTHER PUBLICATIONS

PCT/ISA/210 Search Report issued on PCT/KR2020/001223, dated May 19, 2020, pp. 5.
(Continued)

*Primary Examiner* — David B Lugo
(74) *Attorney, Agent, or Firm* — The Farrell Law Firm, P.C.

(57) ABSTRACT

According to various embodiments, an electronic device in a wireless communication system may include a Power Amplifier (PA) for a first frequency band, a Low Noise Amplifier (LNA) for a second frequency band at least partially overlapping a frequency band which is twice the first frequency band, and an impedance tuner which is in a first impedance state or a second impedance state under the control of the processor. The PA and the impedance tuner may be electrically coupled. A harmonic output level of the PA in the first impedance state may be greater than a harmonic output level of the PA in the second impedance state. The processor may be configured to control the impedance tuner to be in the second impedance state when communication is performed both in the first frequency band and the second frequency band, and control the impedance
(Continued)

tuner to be in the first impedance state when communication is performed only in the first frequency band.

20 Claims, 7 Drawing Sheets

(52) U.S. Cl.
CPC .. *H03F 2200/165* (2013.01); *H03F 2200/294* (2013.01); *H03F 2200/451* (2013.01); *H04B 2001/0408* (2013.01)

(56) References Cited

U.S. PATENT DOCUMENTS

| | | | |
|---|---|---|---|
| 2010/0203847 | A1 | 8/2010 | Gorbachov |
| 2012/0169565 | A1 | 7/2012 | Morris, III |
| 2013/0187712 | A1 | 7/2013 | Cabanillas et al. |
| 2015/0065072 | A1* | 3/2015 | Mohammadi ........ H03G 3/3036 455/127.2 |
| 2015/0198718 | A1 | 7/2015 | Khalili et al. |
| 2016/0294425 | A1* | 10/2016 | Hwang ................ H04B 1/1027 |
| 2016/0323053 | A1 | 11/2016 | Kang et al. |
| 2018/0109275 | A1 | 4/2018 | Kishimoto |
| 2018/0241355 | A1 | 8/2018 | Shounai et al. |
| 2018/0317232 | A1* | 11/2018 | Kumar ................ H04W 72/542 |

OTHER PUBLICATIONS

PCT/ISA/237 Written Opinion issued on PCT/KR2020/001223, dated May 19, 2020, pp. 5.

\* cited by examiner

ELECTRONIC DEVICE AND METHOD FOR PROCESSING HARMONIC SIGNAL

PRIORITY

This application is a National Phase Entry of International Application No. PCT/KR2020/001223, which was filed on Jan. 23, 2020, and claims priority to Korean Patent Application No. 10-2019-0009322, which was filed on Jan. 24, 2019, the entire content of each of which is incorporated herein by reference.

BACKGROUND

1. Field

Various embodiments described below relate to an electronic device for processing a harmonic signal, and an operating method thereof.

2. Related Art

A harmonic component of a signal in a service frequency band causes interference to another frequency band. In order to remove such interference, a notch filter may be used in the service frequency band or a scheme of decreasing transmit power is taken into account. However, there is a problem in that the interference cannot be sufficiently removed by using the filter alone, and performance deteriorates in the service frequency band when the transmit power is excessively decreased.

SUMMARY

An electronic device according to various embodiments can reduce a harmonic component causing interference to another frequency band by using an impedance tuner of an antenna stage.

In addition, the electronic device according to various embodiments can reduce a harmonic component which interferes with another frequency band through a filter.

Technical problems to be achieved in the disclosure are not limited to the technical problems mentioned above, and other technical problems not mentioned herein can be clearly understood by those skilled in the art to which the disclosure pertains from the following descriptions.

According to various embodiments, an electronic device in a wireless communication system may include a Power Amplifier (PA) for a first frequency band, a Low Noise Amplifier (LNA) for a second frequency band at least partially overlapping a frequency band which is twice the first frequency band, and an impedance tuner which is in a first impedance state or a second impedance state under the control of the processor. The PA and the impedance tuner may be electrically coupled. A harmonic output level of the PA in the first impedance state may be greater than a harmonic output level of the PA in the second impedance state. The processor may be configured to control the impedance tuner to be in the second impedance state when communication is performed both in the first frequency band and the second frequency band, and control the impedance tuner to be in the first impedance state when communication is performed only in the first frequency band.

According to various embodiments, a method of operating an electronic device in a wireless communication system may include configuring an impedance tuner to a first impedance state when communication is performed in a first frequency band and communication is not performed in a second frequency band, and configuring the impedance tuner to a second impedance state when communication is performed both in the first frequency band the second frequency band. The second frequency band may at least partially overlap a frequency band which is twice the first frequency band. A harmonic output level of a PA operating in the first frequency band in the first impedance state may be greater than a harmonic output level of the PA in the second impedance state.

An electronic device and method thereof according to various embodiments can effectively control a harmonic component based on a signal of a service frequency band, thereby providing a communication environment which minimizes performance degradation of a service band and ensures performance of another frequency band.

Advantages acquired in the disclosure are not limited to the aforementioned advantages. Other advantages not mentioned herein can be clearly understood by those skilled in the art to which the disclosure pertains from the following descriptions.

DETAILED DESCRIPTION

Terms used in the disclosure are for the purpose of describing particular embodiments only and are not intended to limit other embodiments. A singular expression may include a plural expression unless there is a contextually distinctive difference. Unless otherwise defined, all terms (including technical and scientific terms) used herein have the same meaning as commonly understood by those ordinarily skilled in the art disclosed in the disclosure. It will be further understood that terms, such as those defined in commonly used dictionaries, should be interpreted as having a meaning that is consistent with their meaning in the context of the relevant art, and will not be interpreted in an idealized or overly formal sense unless expressly so defined herein. Optionally, the terms defined in the disclosure should not be interpreted to exclude the embodiments of the disclosure.

A hardware-based approach is described for example in the various embodiments of the disclosure described hereinafter. However, since the various embodiments of the disclosure include a technique in which hardware and software are both used, a software-based approach is not excluded in the embodiments of the disclosure.

The disclosure described hereinafter relates to an apparatus and method for processing a harmonic signal in a wireless communication system. Specifically, the disclosure describes a technique in which a filter is disposed to a transmission path or a transmission/reception path in the wireless communication system and an impedance matching circuit of an antenna is used, thereby effectively removing the harmonic signal.

Terms used in the following description, i.e., a term (e.g., a frequency, a cell, a frequency range, a service band, a service frequency, a communication frequency, a multiplication frequency, a frequency domain) referring to a frequency band, a term (e.g., a band reject filter, a band stop filter, a notch filter, a network entity) referring to a circuit which performs a specific function, a term referring to a component of a device, or the like, are examples for convenience of explanation. Accordingly, the disclosure is not limited to the terms described below, and other terms having equivalent technical meanings may also be used.

Figure 1:
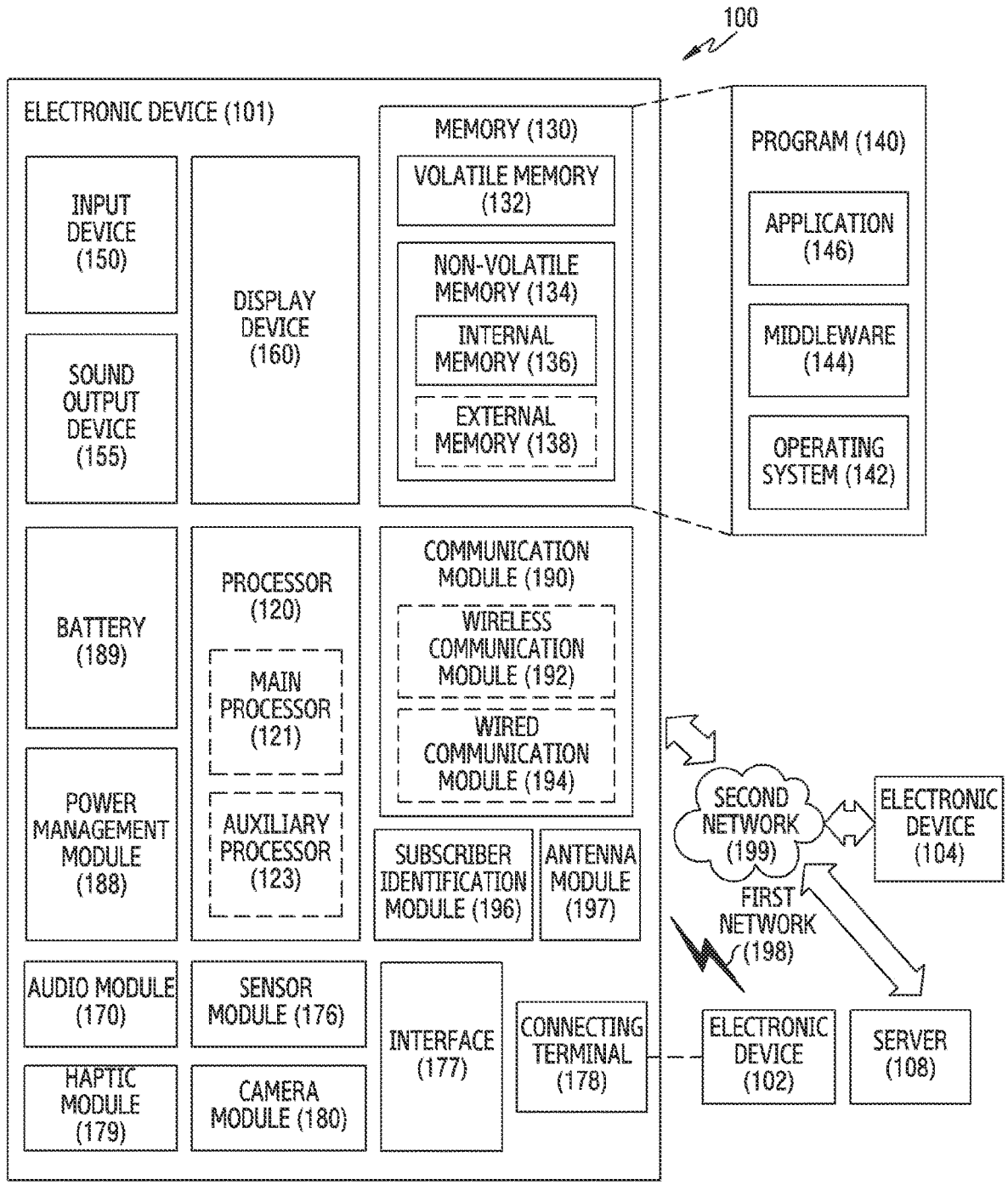
FIG. 1 is a block diagram of an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (TR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device 101 configures a frequency band for performing communication. Herein, the frequency band means a frequency domain specified for communication. The frequency band may be defined in various manners according to a purpose of communication. For example, a frequency band for cellular communication may be defined. In addition, for example, a frequency band for satellite communication may be defined. The electronic device 101 may configure a filter to transmit or receive a signal of a specific frequency range through a specified band.

The electronic device 101 may perform satellite communication. The satellite communication means a communication scheme in which the electronic device 101 obtains ground location information through a satellite. The electronic device 101 may receive a signal (hereinafter, a satellite signal) transmitted from the satellite. The satellite signal may be referred to as a Global Navigation Satellite System (GNSS) signal. The electronic device 101 may include a GNSS receiver to receive a satellite signal. The electronic device 101 may configure a filter to transmit or receive a signal of a GNSS band. The GNSS band means a frequency range in which the satellite signal is transmitted, and is defined according to a type of a satellite system in use (e.g., a GPS in the United States, GLONASS in Russia, Galileo in Europe, Beidou in China, QZSS in Japan). For example, the GNSS band may include an L1 band and an L2 band for a Global Positioning System (GPS). Herein, the L1 band means a frequency range of 1560 MHz to 1598 MHz. The L2 band may include a frequency band of 1215 MHz to 1240 MHz.

The electronic device 101 may transmit a radio signal to another electronic device (e.g., a base station or a user equipment). In this case, a harmonic component of the transmitted radio signal may at least partially overlap another frequency band. The harmonic component may act as an interference signal for another frequency band. For example, the electronic device 101 may simultaneously perform cellular communication and satellite communication. In this case, a harmonic component of a cellular signal of the electronic device 101 may act as interference to the satellite signal. For example, when the service frequency band is a Long Term Evolution (LTE) Band 13 (hereinafter, a B13 band) and the GNSS frequency band is the L1 band, a secondary harmonic component of the B13 band may act as interference to a signal of the L1 band. In order to remove the harmonic component, a notch filter (a band reject filter) may be used, or a scheme of decreasing transmit power may be considered.

Meanwhile, reception performance of the satellite signal may not be easily recovered when only the notch filter is used in a specific service band. In addition, if transmit power is decreased in the service frequency band to recover the reception performance of the satellite signal, significant performance degradation may occur in the existing service frequency band. For example, when the service frequency band is an LTE Band 14 (usage: public safety) (hereinafter, the B14 band) and the GNSS frequency band is the L1 band, the secondary harmonic component of the signal of the B14 band (e.g. 788 MHz) may act as much greater interference to the L1 band, compared to the B13 band. This is because the secondary harmonic component of the B14 band is closer to the L1 band than the secondary harmonic component of the B13 band.

It is not easy to remove the harmonic component when only the notch filter is used, and even if the transmit power is decreased, it may be required to decrease the transmit power of the B14 band by at least 5 dB in order to increase a GNSS value by 1 dB. Therefore, hereinafter, various embodiments of the disclosure propose an apparatus and method for using a notch filter and impedance tuning of an antenna stage to reduce GNSS performance degradation caused by a harmonic component of a Radio Frequency (RF) band served and to improve GNSS performance.

Figure 2:
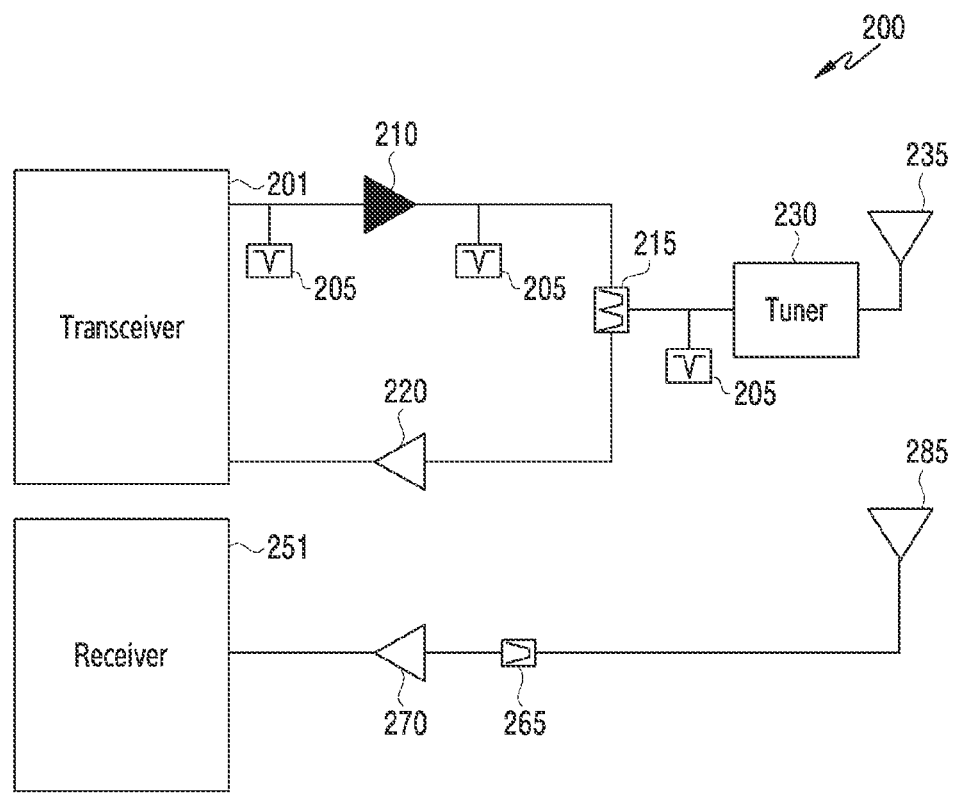
FIG. 2 illustrates an example of an electronic device for processing a harmonic signal according to various embodiments of the disclosure.

FIG. 2 illustrates an example 200 of the electronic device 101 for processing a harmonic signal according to various embodiments of the disclosure. In the disclosure, harmonic signal processing means a processing operation of performing impedance turning to remove a harmonic component of a signal (hereinafter, a harmonic signal) to be output through a notch filter or to suppress the harmonic component or increase linearity of an amplifier.

Referring to FIG. 2, the electronic device 101 may include a transceiver 201. The electronic device 101 may transmit or receive a signal through the transceiver 201. The electronic device 101 may perform a function of conversion between a baseband signal and a bit-stream according to a physical layer standard of a system. For example, in data transmission, the electronic device 101 may generate complex symbols by coding and modulating a transmission bit-stream. In addition, in data reception, the electronic device 101 may restore a reception bit-stream by demodulating and decoding a baseband signal.

The electronic device 101 may include a Power Amplifier (PA) 210 to transmit a signal. The electronic device 101 may transmit a radio signal having sufficient power through the PA 210. In addition, the electronic device 101 may include a mixer, an oscillator, and a Digital-to-Analog Converter (DAC). The electronic device 101 may include a Low Noise Amplifier (LNA) 220 to receive a signal. The electronic device 101 may use the LNA to amplify a received signal while minimizing noise. In addition, the electronic device 101 may include a mixer, an oscillator, and an Analog-to-Digital Converter (ADC). The electronic device 101 may up-convert a baseband signal into a Radio Frequency (RF) signal and thereafter transmit it through an antenna 235, and may down-convert an RF signal received via the antenna 235 into a baseband signal.

The electronic device 101 may include a duplexer 215 to transmit or receive a radio signal in a service frequency band. The electronic device 101 may identify signals in a frequency range corresponding to the service frequency band among signals received through the duplexer 215. For example, when the service frequency band is an LTE Band 14 (hereinafter, a B14 band), the electronic device 101 may identify a signal of 788 MHz to 798 MHz and a signal of 758 MHz to 768 MHz through the duplexer 215. The duplexer 215 may include a filter for filtering a signal out of a transmission frequency range and a filter for filtering a signal out of a reception frequency range. Hereinafter, the service frequency band is a frequency band in which a harmonic component acts as interference to a GNSS frequency band, and may be referred to as an interference providing band.

The electronic device 101 may include a receiver 251. The electronic device 101 may obtain, through the receiver 251, information on a location of the electronic device 101, which is included in a signal transmitted from a satellite, i.e., a satellite signal. The electronic device 101 may include a satellite antenna 285 to receive the satellite signal. The electronic device 101 may receive the satellite signal through the satellite antenna 285. The electronic device 101 may include an LNA 270 to amplify the received satellite signal and minimize a noise component. The electronic device 101 may obtain a signal of a GNSS band. The electronic device 101 may include a band-pass filter 265 to obtain the satellite signal among the received signals. The electronic device 101 may identify the signal of the GNSS frequency band through the band-pass filter 265. For example, the electronic device 101 may identify the satellite signal of 1560 MHz to 1598 MHz corresponding to an L1 band. Hereinafter, the GNSS band is a frequency band interfered from a harmonic signal of a service frequency band, and may be referred to as an interference occurring band.

A signal received via the satellite antenna 285 may include not only the satellite signal but also other signals. For example, a harmonic component (e.g., a secondary harmonic component) of the service frequency band may be included. When the service frequency band is the B14 band, a frequency of a secondary harmonic signal of a radio signal of 788 MHz may be 1576 MHz. Since the band-pass filter 265 allows a signal of 1560 MHz to 1598 MHz to pass, the secondary harmonic signal may be transmitted to the receiver 251 through a reception path of the satellite signal. In order to remove the harmonic signal, a notch filter 205 may be disposed to the duplexer 215 which filters the signal of the service frequency band. The notch filter 205 filters the frequency band of the secondary harmonic signal. According to an embodiment, in the absence of the notch filter 205 of the duplexer 215, 2 dB performance degradation of the GNSS band may occur. The notch filter may be disposed to the duplexer 215 to ensure reception sensitivity of the GNSS.

The harmonic component may be caused by a non-linear element, and the PA may include the non-linear element. Accordingly, the electronic device 101 may include a notch filter coupled to at least one of an input stage and output stage of the PA 210 in order to ensure the reception sensitivity of the GNSS. Even if the notch filter of the duplexer stage does not sufficiently remove the harmonic component, the harmonic signal can be more effectively removed since the notch filter is disposed to at least one of the input stage and output stage of the PA. The notch filter 205 may be disposed in front of or next to the PA 210 located on the transmission path of the service frequency band. According to an embodiment, when there is no notch filter 205 in the output stage of the PA 210, 3 dB performance degradation may occur in the GNSS band. In addition, when there is no notch filter 205 in the input stage of the PA 210, 2 dB performance degradation may occur in the GNSS band.

Harmonics are integer multiples of a fundamental frequency, i.e., multiplication components (e.g., 2 times, 3 times, 4 times, . . . , N times), and are caused by resonance. Due to resonance occurring on a given structure, it may be difficult to completely remove a harmonic component included in a signal when only the notch filter 205 is used. Therefore, according to various embodiments, the electronic device 101 may perform impedance tuning. The electronic device 101 may reduce a magnitude of a harmonic signal to be output, by tuning impedance associated with an antenna through a tuner 230. Since the tuner 230 is disposed to the antenna stage, the harmonic signal can be more effectively removed. The tuner 230 controls a value of an element to find a desired matching value. According to various embodiments, the tuner 230 may be configured to a matching value for providing a low output level in a frequency range corresponding to a harmonic component. The tuner 230 may suppress a harmonic component of a radio signal to be output. Through impedance tuning, a non-linear component included in an output of an amplifier can be reduced. Even if power consumption increases due to a failure in power-efficient matching, the harmonic component may decrease as linearity is satisfied.

According to various embodiments, the electronic device 101 may include the notch filters 205 capable of removing a harmonic component of a service frequency band and the tuner 230 for suppressing a harmonic component radiated through matching of a stage of the antenna 235. Specifically, the electronic device 101 according to various embodiments may use the notch filter 205 located in an input stage and output stage of the PA 210 to remove a harmonic component of a service frequency band which provides interference to a GNSS frequency band. In addition, the electronic device 101 according to various embodiments may use the notch filter 205 located in the duplexer 215 to remove a harmonic signal of a service frequency band which has not been sufficiently removed from an input/output of the PA. In other words, the electronic device 101 may use the notch filter 205 to remove a harmonic component which may be caused on a transmission path of a signal of a service frequency band, i.e., a signal transmission path, to the maximum extent possible. Thereafter, the electronic device 101 according to various embodiments may minimize a magnitude of a harmonic component which is not removed by using the notch filter through the tuner 230. The tuner 230 may be located in front of the antenna 235 in order to optimize GNSS performance through impedance matching of the antenna stage. A value of an element (e.g., a resistor, a capacitor, an inductor) of the tuner 230 may be set to suppress an output magnitude of the harmonic signal via the antenna. Meanwhile, although the tuner 230 is described as an example in FIG. 2, the electronic device 101 may also include an antenna switch. Impedance tuning may be performed depending on switch ON/OFF.

According to various embodiments, an electronic device in a wireless communication system may include a Power Amplifier (PA) for a first frequency band, a Low Noise Amplifier (LNA) for a second frequency band at least partially overlapping a frequency band which is twice the first frequency band, and an impedance tuner which is in a first impedance state or a second impedance state under the control of the processor. The PA and the impedance tuner may be electrically coupled. A harmonic output level of the PA in the first impedance state may be greater than a harmonic output level of the PA in the second impedance state. The processor may be configured to control the impedance tuner to be in the second impedance state when communication is performed both in the first frequency band and the second frequency band, and control the impedance tuner to be in the first impedance state when communication is performed only in the first frequency band.

According to various embodiments, the electronic device may further include a first notch filter electrically coupled to an input stage of the PA, and a second notch filter electrically coupled to an output stage of the PA. The first notch filter and the second notch filter may be configured to remove a harmonic component of the first frequency band.

According to various embodiments, the electronic device may further include a duplexer which allows a signal of the first frequency band to pass, a Radio Frequency (RF) antenna which transmits or receives a signal of the first frequency band, and a satellite antenna which receives a signal of the second frequency band.

According to various embodiments, the electronic device may further include a third notch filter coupled to the duplexer. The third notch filter may be configured to remove a harmonic component of the first frequency band.

According to various embodiments, the impedance tuner may be electrically coupled to the RF antenna. First transmit power of a radio signal transmitted using the RF antenna related to the first impedance state may be less than second transmit power of the radio signal related to the second impedance state. First reception sensitivity of the satellite antenna related to the first impedance state may be lower than second reception sensitivity of the satellite antenna related to the second impedance state.

According to various embodiments, the impedance tuner may include a first filter portion electrically coupled to the duplexer and a second filter portion electrically coupled with the RF antenna. The first filter portion may include a first capacitor and a first inductor. The second filter portion may include a second capacitor and a second inductor. The first capacitor may be coupled to the duplexer in parallel. The second capacitor may be coupled to the antenna in parallel. The first inductor and the second inductor may be coupled in series.

According to various embodiments, each of the first inductor and the second inductor may be an element for providing a fixed value. Each of the first capacitor and the second capacitor may be a variable element.

According to various embodiments, the processor may be configured to identify a first capacitance value and second capacitance value corresponding to the first impedance to control the impedance tuner to be in the first impedance state, and configure the tuner so that the first capacitor has the identified second capacitance value and the second capacitor has the identified second capacitance value. The processor may be configured to identify a third capacitance value and fourth capacitance value corresponding to the second impedance to control the impedance tuner to be in the second impedance state, and configure the tuner so that the first capacitor has the identified third capacitance value and the second capacitor has the identified fourth capacitance value.

According to various embodiments, the electronic device may further include a memory which stores information on a plurality of impedance states including the first impedance state and the second impedance state. The processor may be further configured to identify a communication state, based on an extent to which a harmonic component of the first frequency band affects the second frequency band, identify an impedance state corresponding to the identified communication state among the plurality of impedance states, and configure the tuner according to the identified impedance state.

According to various embodiments, in the electronic device, the first frequency band may be a B14 band, and the second frequency band may be a GPS L1 band.

The tuner may control a value of each element so that an output level of a corresponding signal is decreased at a frequency of a harmonic signal to be suppressed, that is, in a frequency range of an interference occurring band. Hereinafter, a detailed example and design scheme of the tuner will be described with reference to FIG. 3.

Figure 3:
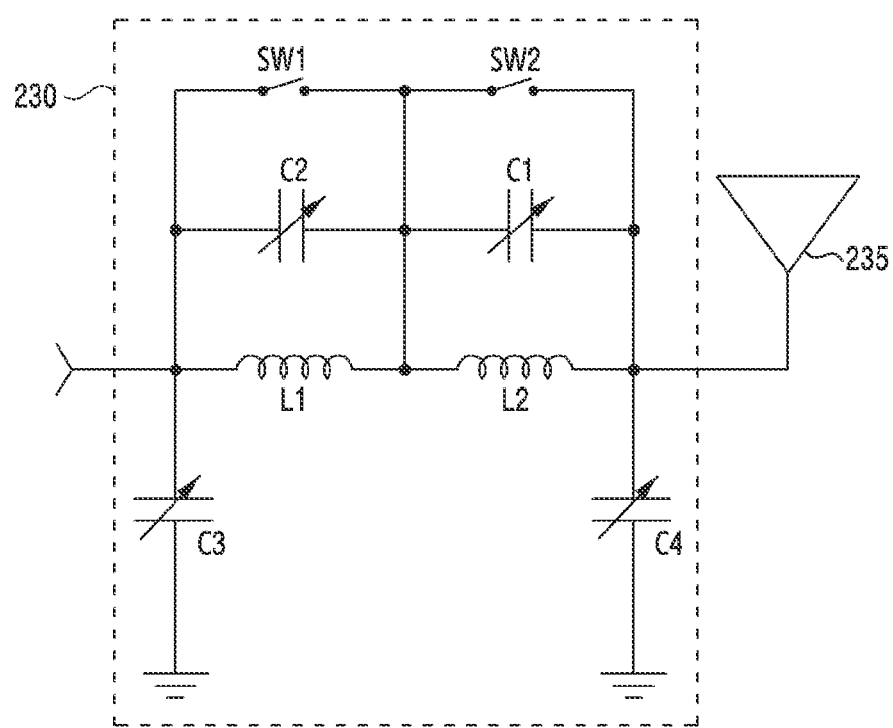
FIG. 3 illustrates an example of a tuner for processing a harmonic signal according to various embodiments.

FIG. 3 illustrates an example 300 of the tuner 230 for processing a harmonic signal according to various embodiments. The electronic device 101 may perform impedance tuning through the tuner 230. The tuner 230 may perform harmonic processing through a matching circuit. The example 300 of the tuner 230 of FIG. 3 is only an example of a circuit for impedance matching with the antenna 235 for a transmission signal, and various embodiments of the disclosure are not limited thereto.

Referring to FIG. 3, the tuner 230 according to various embodiments may include a matching circuit. On a transmission path, there may be an impedance difference between a stage of the duplexer 215 and a stage of the antenna 235. The impedance difference causes a return loss. The return loss may be expressed as a reflection coefficient or a Voltage Standing Wave Ratio (VSWR). The VSWR manes a standing wave which is created when a wave travels and merges with a wave reflected by another medium. The reflection coefficient may be defined by equation (1) below.

$$\Gamma = \frac{Z_L - Z_0}{Z_L + Z_0} \quad (1)$$

Herein, $Z_L$ denotes impedance of a load (e.g., an antenna), and $Z_0$ denotes characteristic impedance.

The VSWR may be defined by equation (2) below.

$$VSWR = \frac{1 + |\Gamma|}{1 - |\Gamma|} \quad (2)$$

Herein, $\Gamma$ denotes a reflection coefficient.

The electronic device 101 may decrease the return loss through the matching circuit. That is, the electronic device 101 may insert the tuner 230 between input impedance and output impedance to control an impedance difference between two connecting stages. According to an embodiment, the electronic device 101 may increase power efficiency of a PA of a service frequency band through impedance matching.

According to various embodiments, the tuner 230 may include a first capacitor C1, a second capacitor C2, a third capacitor C3, a fourth capacitor C4, a first inductor L1, a second inductor L2, a first switch SW1, and a second switch SW2. The tuner 230 may include an LC filter coupled to an input stage of a signal and an LC filter coupled to an output stage. The two LC filters may be coupled in series. The first inductor L1 and the second inductor L2 may be coupled in series, and the third capacitor C3 and the fourth capacitor C4 may be coupled in parallel. Elements may be independently coupled to each of the input stage and the output stage. Accordingly, the tuner may set an impedance value in a relatively wider range on a Smith chart than a general pi-type matching circuit. In other words, the tuner 230 may have a relatively wide range of a controllable return loss (or a reflection coefficient, a VSWR). Meanwhile, although it is illustrated that two inductive elements are coupled in series in FIG. 3, it is obvious that more than two inductors can be coupled in series. The more the number of inductors coupled in series increases, the wider the range of the controllable bandwidth.

According to various embodiments, the electronic device 101 may determine an impedance value of the tuner 230 by controlling values of elements of the tuner 230. Instead of setting all values variably, the number of variable elements may be minimized to minimize an insertion loss in a matching network. For example, the first capacitor C1, the second capacitor C2, the third capacitor C3, and the fourth capacitor C4 may be tunable elements. A capacitance value of each capacitor may be adjusted. The first inductor L1 and the second inductor L2 may be fixed elements having fixed values. Each inductor may have a fixed inductance value. Although it is illustrated in FIG. 3 that the inductor is a fixed element and the capacitor is a variable element, the disclosure is not limited thereto. According to an embodiment, it is obvious that the inductor is a variable element.

According to various embodiments, the tuner 230 may include the first switch SW1 coupled to both ends of the first capacitor C1 and the second switch SW2 coupled to both ends of the second capacitor C2. If the variable capacitor has a wide variation range for impedance matching, a large loss may be caused. At least one of the first capacitor C1 and the second capacitor C2 may be bypassed even at low RF impedance through the first switch SW1 and the second switch SW2. The electronic device 101 may perform efficient impedance tuning by adjusting a capacitance value of the third capacitor C3 and a capacitance value of the fourth capacitor C4.

A signal output through the PA may be non-linear with respect to an input signal, and an Alternating Current (AC) component included in the input signal may cause harmonics of an output signal. When a harmonic signal is transmitted via an antenna with sufficient power through impedance matching, it may cause harmonic interference to another frequency band. Therefore, the tuner 230 according to various embodiments may perform a function of a load adjuster of the PA to suppress harmonics in a service frequency band. Even if power consumption increases by setting an impedance value of the tuner, the electronic device 101 may satisfy linearity of the output signal. When it is said that the linearity is satisfied, it means that non-linear components included in an output of the amplifier are removed. The electronic device 101 may suppress a harmonic signal through impedance tuning.

The electronic device 101 according to various embodiments may identify impedance of the tuner 230, which improves GNSS performance in an interference occurring band. The electronic device 101 may define the identified impedance as a tuner state. That is, the defined tuner state causes great power consumption while increasing linearity and decreasing a harmonic component. An impedance value of the defined tuner state may be different from an impedance value of a tuner which causes a harmonic component while decreasing power consumption used for transmission in a service frequency band.

According to various embodiments, various tuner states may be defined depending on a purpose of communication. The tuner state means a value of a variable element or a combination of values of the variable elements for providing a specific value to the impedance of the tuner. The electronic device 101 may include a memory (e.g., the memory 130 of FIG. 1) which stores information on a plurality of tuner states. The electronic device 101 may identify one tuner state among the plurality of tuner states according to the purpose. For example, in order to reduce power consumption used for transmission of a signal of a service frequency band without considering harmonic interference of another frequency band, the electronic device 101 may identify a tuner state corresponding to impedance which provides maximum efficiency through impedance matching, i.e., impedance which provides a relatively low VSWR (i.e., a VSWR close to 1). As another example, when a frequency band affected by harmonics of the service frequency band is in use, the electronic device 101 may identify a tuner state corresponding to an impedance value which suppresses a harmonic component, in other words, impedance which prevents a signal in a frequency domain corresponding to harmonics from passing among the plurality of tuner states. The electronic device 101 may configure the tuner 230 according to the identified tuner state.

According to various embodiments, the electronic device 101 may tune the tuner 230 to obtain values of elements of the tuner 230 so that a harmonic magnitude of an interference providing band is minimized in an interference occurring band. The electronic device 101 may associate the obtained values with a tuner state for harmonic processing. The electronic device 101 may apply the values of the element of the tuner state when the service frequency band and the interference occurring band are in use. Performance improvement in the interference occurring band may be maximized while minimizing performance degradation in the service frequency band. According to an embodiment, when the interference occurring band is the GNSS L1 band and the interference providing band is the B14 band, performance may be measured as shown in Table 1 below.

TABLE 1

| tuner state | B14 bandwidth transmit (dBm) | GNSS reception sensi (dBm) |
|---|---|---|
| a first tuner state | 17.8 | −146.0 |
| a second tuner state | 17.2 | −150.0 |

According to the tuner state, it can be seen that a transmit power change in the service frequency band (e.g., B14 band) is 0.6 dB, while reception sensitivity is improved by 4 dB in the interference occurring band (e.g., GNSS L1 band). Since the reception sensitivity means a magnitude of an identifiable signal, the lower the corresponding index, the better the reception performance. The reception sensitivity of the GNSS may be improved by decreasing a magnitude of a harmonic component caused in a receiving end of the interference occurring band.

Although a structure of a tuner and tuner states of two purposes are described in FIG. 3, various embodiments of the disclosure are not limited thereto. According to various embodiments, it is obvious that at least two tuner states may be defined. Each tuner state may be defined in various manners according to at least one of a characteristic of a service frequency band, a type of a service being used in the service frequency band, a set bandwidth, and capability of the electronic device. Hereinafter, operations for identifying a tuner state to process a harmonic signal and configuring a tuner according to the identified tuner state are described with reference to FIG. 4 to FIG. 5.

Figure 4:
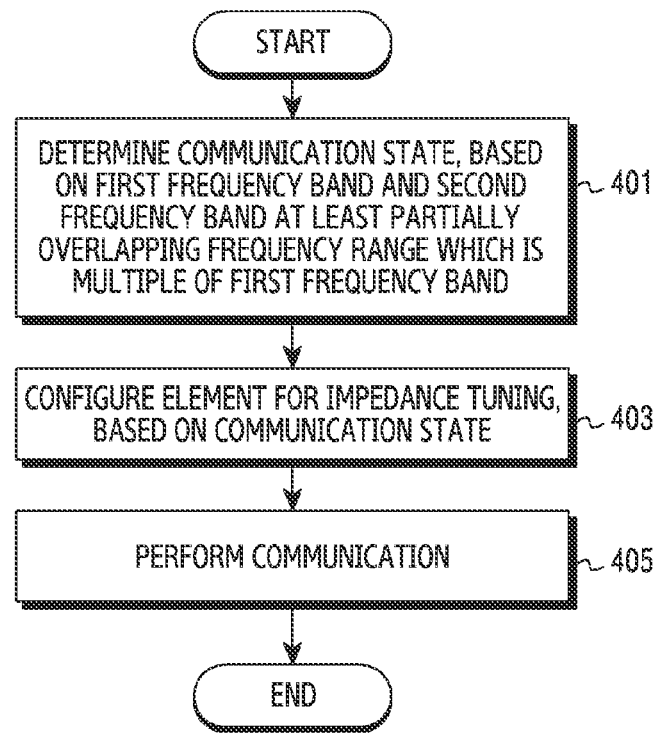
FIG. 4 illustrates an operational flow of an electronic device for processing a harmonic signal according to various embodiments.

FIG. 4 illustrates an operational flow 400 of the electronic device 101 for processing a harmonic signal according to various embodiments. An operation of the electronic device 101 may be performed by the processor 120 of FIG. 1.

Referring to FIG. 4, according to various embodiments, in operation 401, the electronic device 101 may determine a communication state, based on a first frequency band and a second frequency band at least partially overlapping a frequency range which is a multiple of the first frequency band.

According to various embodiments, the first frequency band may be a frequency band for transmitting a signal to another electronic device or another network entity as a service frequency band. The second frequency band may be a signal reception band. Since a frequency band which is a multiple of the first frequency band at least partially overlaps the second frequency band, a harmonic component of a signal of the first frequency band may be introduced to the second frequency band. In other words, the harmonic component of the first frequency band may act as an interference signal when receiving a signal of the second frequency band. Even if the electronic device 101 uses a filter which allows a specific frequency range to pass in order to receive the signal of the second frequency band, since a frequency range of the second frequency band includes a frequency of a harmonic component, the harmonic component may be transferred to a receiver for the second frequency band.

According to various embodiments, the electronic device 101 may determine the communication state, based on the first frequency band and the second frequency band, that is, an interference providing band and an interference occurring band. Herein, the communication state means a state indicating an extent of influence of harmonic interference which may occur in the second frequency band. The communication state may be determined based on at least one of whether each frequency band is in use, a relationship between the frequency bands, an extent of influence among the frequency bands, or a weight of each frequency band.

In some embodiments, the electronic device 101 may determine the communication state according to whether the first frequency band is in use and whether the second frequency band is in use. For example, two communication states may be defined by distinguishing a case where both the first frequency band and the second frequency band are in use and the otherwise case. A detailed example will be described below with reference to FIG. 5.

In addition, in some embodiments, the electronic device 101 may determine the communication state, based on an extent to which the first frequency band affects the second frequency domain. Although the signal of the first frequency band causes harmonic interference to the second frequency band, if the reception sensitivity of the signal of the second frequency band is sufficiently high, the harmonic interference may not be considered. For example, two communication states may be defined by distinguishing a case where a magnitude of harmonic interference against signal sensitivity of the second frequency domain is equal to or greater than a threshold and the otherwise case. If the magnitude of harmonic interference against the signal sensitivity of the second frequency domain is equal to or greater than the threshold, the electronic device 101 may perform impedance tuning to increase linearity and reduce a harmonic component. Otherwise, if the magnitude of the harmonic interference against the signal sensitivity of the second frequency band is less than the threshold, the electronic device 101 may increase power efficiency of a PA of the signal of the first frequency band through impedance matching.

In addition, in some embodiments, the electronic device 101 may determine the communication state, based on a first weight for the first frequency band and a second weight for the second frequency band. If an extend of performance improvement of the second frequency band is relatively significantly inferior to that of the first frequency band, although the signal of the first frequency band causes harmonic interference to the second frequency band, the electronic device 101 may not consider the harmonic interference. For example, two communication states may be defined by distinguishing a case where the extent of performance improvement of the second frequency band against an extent of performance degradation of the first frequency band is less than a second weight against a first weight (hereinafter, a weight ratio) and the otherwise case.

If the extent of performance improvement of the second frequency band against the extent of performance degradation of the first frequency band is lower than the weight ratio, the electronic device 101 may increase power efficiency of a PA in the first frequency band through impedance matching. Otherwise, if the extent of performance improvement of the second frequency band against the extent of performance degradation of the first frequency band is higher than the weight ratio, the electronic device may perform impedance tuning to increase linearity and reduce a harmonic component.

There is a trade-off relation between harmonic component removal and power consumption. In the aforementioned embodiments, two communication states are taken for example by considering the trade-off relation. The electronic device 101 in a first communication state increases power efficiency in a first frequency band which is a service frequency band and decreases power consumption, but may cause harmonic interference in the second frequency band since linearity is not satisfied. On the other hand, the electronic device 101 in a second communication state satisfies linearity in the first frequency band and thus increases power consumption, but may remove harmonic interference to a greater extent, compared to the second communication state. However, it is obvious that the electronic device 101 according to various embodiments can operate in more than two communication states. According to a weight level, a third communication state may be defined in which a harmonic component is lower than that in the first communication state but is higher than that in the second communication state and in which power consumption for linearity is higher than that in the first communication state but is lower than that in the second communication state.

According to various embodiments, in operation 403, the electronic device 101 may configure an element for impedance tuning, based on the communication state. The impedance tuning may include an operation for controlling an impedance difference between an antenna stage and a duplexer stage. According to an embodiment, the element may include at least one of a resistor, a capacitor, and an inductor. The electronic device 101 may use the impedance tuning to control a load impedance level of the antenna stage, thereby obtaining an output required in each communication state.

The electronic device 101 may identify a tuner state corresponding to the communication state. For example, when a second frequency band is not in use, the electronic device 101 may identify a tuner state in which transmit power performance of the first frequency band is maximized, without considering harmonics of the first frequency band. As another example, when both the first frequency band and the second frequency band are in use, the electronic device 101 may identify a tuner state for suppressing harmonic interference. As another example, when the first frequency band is not in use, the electronic device 101 may maintain a current tuner configuration because there is no harmonic component of a signal of the first frequency band.

The electronic device 101 may configure the tuner according to the tuner state. For example, the electronic device 101 may refer to a look-up table stored in a memory (e.g., the memory 130 of FIG. 1) to identify values of elements corresponding to the tuner state. The electronic device 101 may configure the tuner to provide the identified values for the elements of the tuner located between the antenna and the duplexer.

According to various embodiments, in operation 405, the electronic device 101 may perform communication. The electronic device 101 may transmit a radio signal according to the tuner configured in operation 403. For example, when the electronic device 101 does not use the second frequency band, the electronic device 101 may transmit the radio signal to the antenna stage and the duplexer stage with maximum transmit power adjusted through impedance matching. As another example, when the electronic device 101 is using the first frequency band and the second frequency band at the same time, a radio signal may be transmitted in the first frequency band and a satellite signal may be received in the second frequency band. The electronic device 101 may transmit the radio signal by configuring the tuner to decrease a magnitude of a signal of a frequency range which is twice the first frequency band. According to the tuner configuration of the electronic device 101, the electronic device 101 may receive less harmonic signals of the first frequency band in the second frequency band than when the second frequency band is not in use. Depending on a change in signal sensitivity in the second frequency band, caused by a change in the tuner state, it may be identified that harmonic processing is performed through an impedance matching change according to various embodiments.

Figure 5:
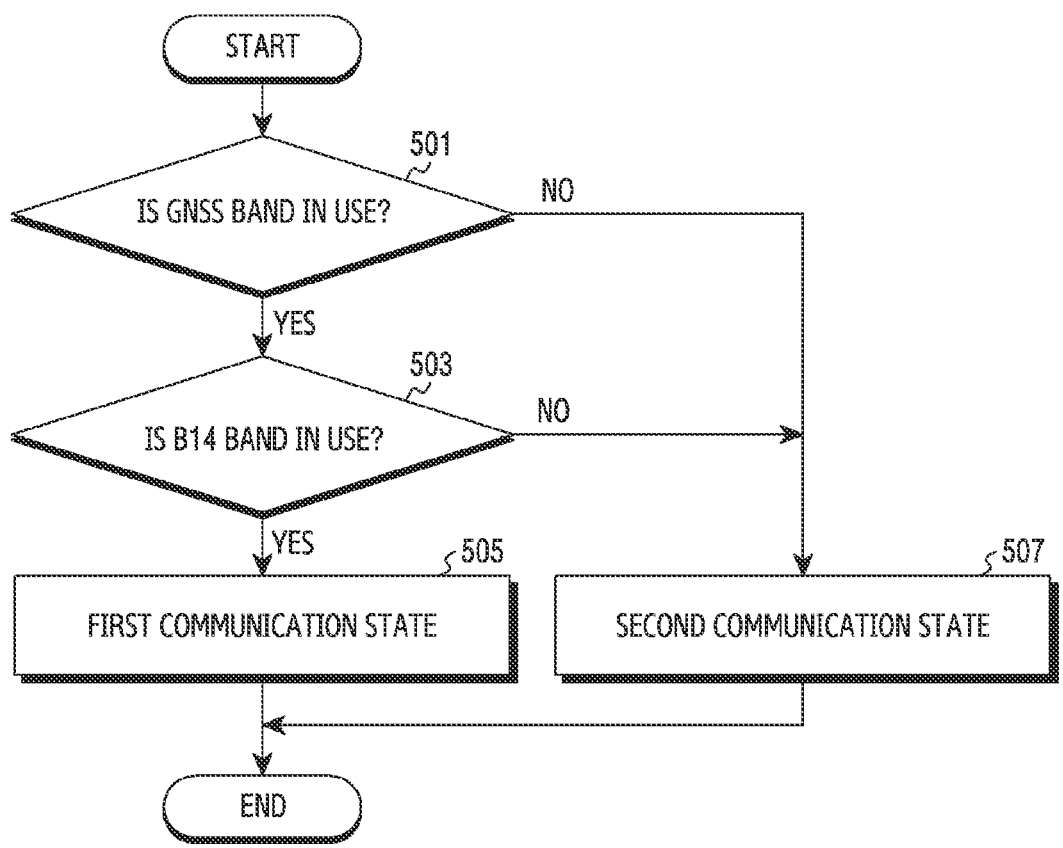
FIG. 5 illustrates an operational flow of an electronic device for determining a communication state to process a harmonic signal according to various embodiments of the disclosure.

FIG. 5 illustrates an operational flow 500 of the electronic device 101 for determining a communication state to process a harmonic signal according to various embodiments of the disclosure. FIG. 5 is part of the operation 401 of FIG. 4, and the operational flow 500 of FIG. 5 may be understood as an operation of the electronic device 101 or a component of the electronic device. In FIG. 5, a situation where a service frequency band causing harmonic interference is a B14 band and a GNSS band in which interference occurs is an L1 band of a GPS is described as an example. The operation of the electronic device 101 may be performed by the processor 120 of FIG. 1.

Referring to FIG. 5, according to various embodiments, in operation 501, the electronic device 101 may determine whether the GNSS band is in use. In some embodiments, the electronic device 101 may determine whether to use the GNSS band, based on whether at least one of a GNSS receiver or an element on a reception path of a GNSS signal (i.e., a satellite signal) is active. In some other embodiments, the electronic device 101 may determine whether to use the GNSS band by detecting whether an application layer activates the satellite signal. The electronic device 101 may perform operation 503 when the GNSS band is currently in use. The electronic device 101 may perform operation 507 when the current GNSS band is not in use.

According to various embodiments, in operation 503, the electronic device 101 may determine whether the B14 band is in use. The electronic device 101 may determine whether there is a signal to be transmitted in the B14 band. The electronic device 101 may receive resource allocation information from a base station. When the electronic device 101 intends to transmit a signal to another node in a time unit, the electronic device 101 may determine that the B14 band is in use in the time unit. For example, when the electronic device 101 is connected to a network in the B14 band (e.g., in an RRC connection state), it may be determined that the B14 band is in use. As another example, upon receiving Downlink Control Information (DCI) including an uplink grant, the electronic device 101 may determine that the B14 band is in use.

The electronic device 101 may perform operation 505 when the B14 band is currently in use. In other words, when both the GNSS band and the B14 band are in use, the electronic device 101 may perform operation 505. If the band B14 is not currently in use, the electronic device 101 may perform operation 507.

According to various embodiments, in operation 505, the electronic device 101 may determine a communication state of the electronic device 101 as a first communication state. The first communication state may be a communication state in which harmonic processing is required due to significant interference of the GNSS band caused by harmonics of the B14 band. In the first communication state, the electronic device 101 may configure the tuner to suppress a harmonic components of the B14 band.

According to various embodiments, in operation 507, the communication state of the electronic device 101 may be determined as a second communication state. The second communication state may be a communication state in which harmonic processing is not required due to insignificant influence of the GNSS band caused by harmonics of the B14 band. That is, in the second communication state, the electronic device 101 may configure the tuner to improve transmission performance of the B14 band. According to an embodiment, the second communication state may be related to a default configuration of the tuner.

Although it is illustrated in FIG. 5 that the operation 507 is performed when the electronic device 101 is using only the GNSS band, this may mean that the second communication state is related to the default configuration and the electronic device 101 maintains a default configuration state. This is because there is no need to change a communication configuration since the B14 band which is a service frequency band is not in use and thus there is no interference source of a harmonic component.

Although it is illustrated in FIG. 5 that the communication state is determined after determining whether the GNSS frequency band and the B14 band are in use, the disclosure is not limited thereto. According to various embodiments, when the both frequency bands are in use, the electronic device 101 may determine a case where an additional condition is satisfied as a first communication state, and may determine the otherwise case as a second communication state, based on at least one of interference caused by a secondary harmonic component of the B14 band and performance of a signal of the GNSS frequency band. According to an embodiment, the additional condition may include that reception performance of the GNSS frequency band is less than a threshold. In addition, according to an embodiment, the additional condition may include that a magnitude of the secondary harmonic component of the B14 band against a signal of the GNSS frequency band is greater than or equal to a reference value.

According to various embodiments, a method of operating an electronic device in a wireless communication system may include configuring an impedance tuner to a first impedance state when communication is performed in a first frequency band and communication is not performed in a second frequency band, and configuring the impedance tuner to a second impedance state when communication is performed both in the first frequency band the second frequency band. The second frequency band may at least partially overlaps a frequency band which is twice the first frequency band. A harmonic output level of a PA operating in the first frequency band in the first impedance state may be greater than a harmonic output level of the PA in the second impedance state.

According to various embodiments, the method may further include removing a harmonic component of the first frequency band by using a first notch filter electrically coupled to an input stage of the PA and a second notch filter electrically coupled to an output stage of the PA.

According to various embodiments, the method may further include using a duplexer to allow a signal of the first frequency band to pass, using a Radio Frequency (RF) antenna to transmit or receive a signal of the first frequency band, and using a satellite antenna to receive a signal of the second frequency band.

According to various embodiments, the method may further include using a third notch filter coupled to the duplexer to remove a harmonic component of the frequency band.

According to various embodiments, the impedance tuner may be electrically coupled to the RF antenna. First transmit power of a radio signal transmitted using the RF antenna related to the first impedance state may be less than second transmit power of the radio signal related to the second impedance state. First reception sensitivity of the satellite antenna related to the first impedance state may be lower than second reception sensitivity of the satellite antenna related to the second impedance state.

According to various embodiments, the impedance tuner may include a first filter portion electrically coupled to the duplexer and a second filter portion electrically coupled with the RF antenna. The first filter portion may include a first capacitor and a first inductor. The second filter portion may include a second capacitor and a second inductor. The first capacitor may be coupled to the duplexer in parallel. The second capacitor may be coupled to the antenna in parallel. The first inductor and the second inductor may be coupled in series.

According to various embodiments, each of the first inductor and the second inductor may be an element for providing a fixed value. Each of the first capacitor and the second capacitor may be a variable element.

According to various embodiments, the configuring of the impedance tuner to the first impedance state may include identifying a first capacitance value and second capacitance value corresponding to the first impedance to control the impedance tuner to be in the first impedance state, and configuring the tuner so that the first capacitor has the identified second capacitance value and the second capacitor has the identified second capacitance value. The configuring of the impedance tuner to the second impedance state may include identifying a third capacitance value and fourth capacitance value corresponding to the second impedance to control the impedance tuner to be in the second impedance state, and configuring the tuner so that the first capacitor has the identified third capacitance value and the second capacitor has the identified fourth capacitance value.

According to various embodiments, the method may further include using a memory to store information on a plurality of impedance states including the first impedance state and the second impedance state, identifying a communication state, based on an extent to which a harmonic component of the first frequency band affects the second frequency band, identifying an impedance state corresponding to the identified communication state among the plurality of impedance states, and configuring the tuner according to the identified impedance state. According to various embodiments, the first frequency band may be a B14 band, and the second frequency band may be a GPS L1 band.

Figure 6A:
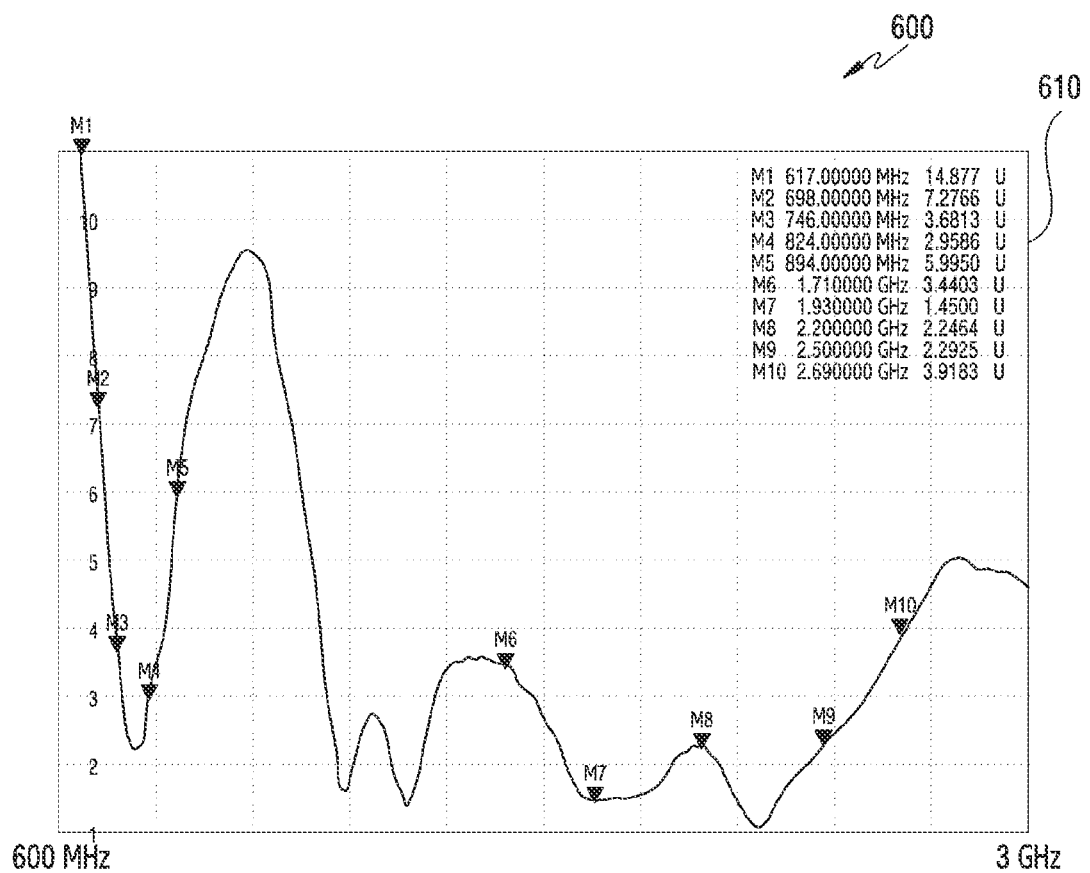
FIG. 6A and FIG. 6B illustrate examples of a Voltage Standing Wave Ratio (VSWR) and Smith chart for processing a harmonic signal according to various embodiments.
Figure 6A:
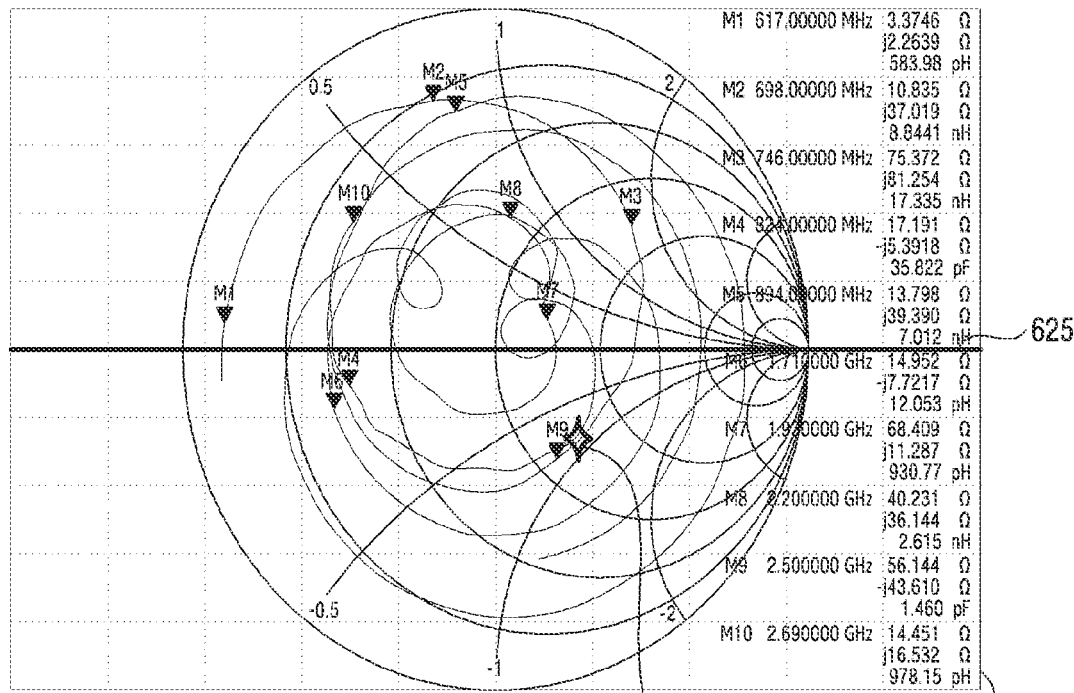
Figure 6B:
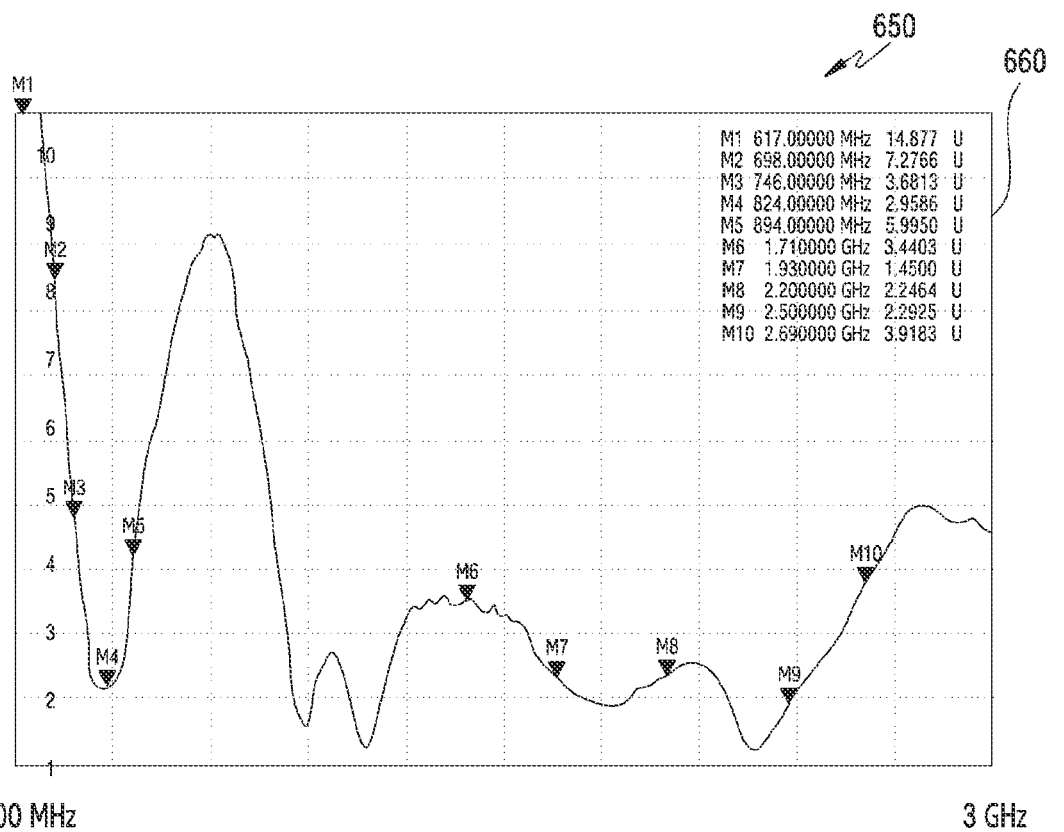
Figure 6B:
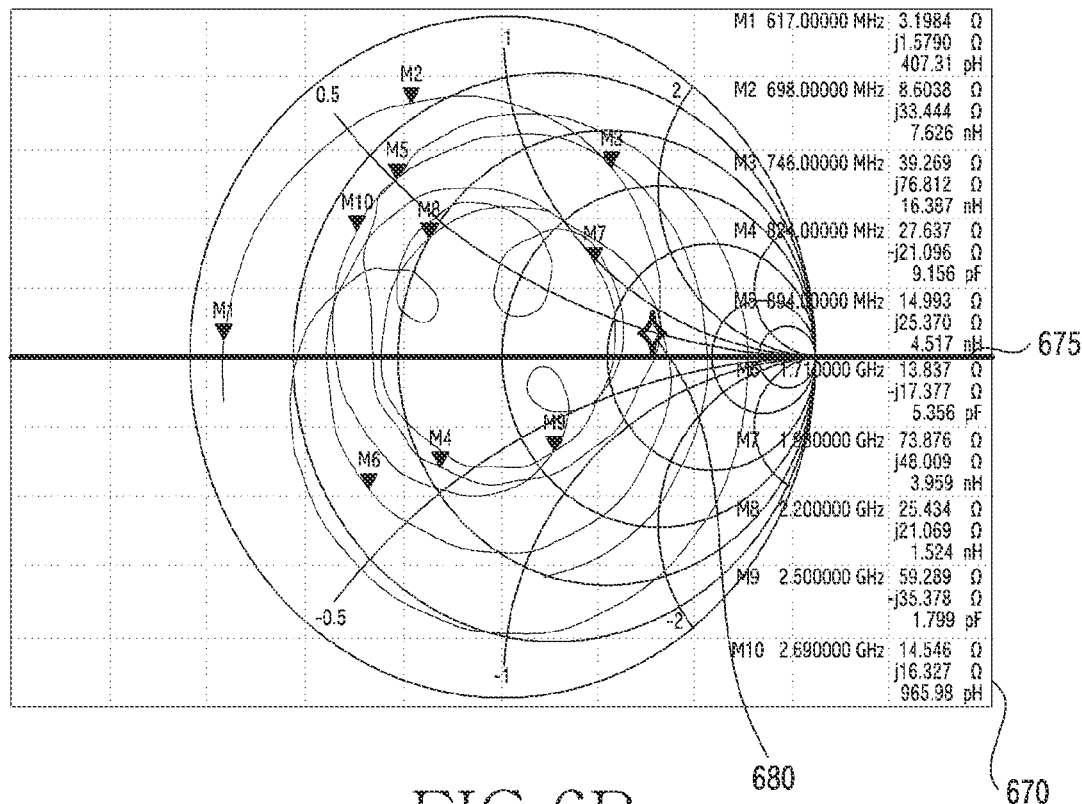

FIG. 6A and FIG. 6B illustrate examples of a VSWR and Smith chart for processing a harmonic signal according to various embodiments. The Smith chart is a circular diagram which visualizes complex impedance, and is shown to explain a configuration of an impedance tuner for processing a harmonic signal according to various embodiments. In the following description, the VSWR and the Smith chart are compared in a configuration of an impedance tuner when only a service frequency band is in use (hereinafter, a first impedance state) and in a configuration of an impedance tuner when the service frequency band and a satellite frequency band are in use together (hereinafter, a second impedance state). The service frequency band may be a B14 band. The satellite frequency band may be a GPS L1 band.

Referring to FIG. 6A, a graph 610 shows a relationship between a frequency and a VSWR in the first impedance state. A horizontal axis represents a frequency of a transmission signal, and a vertical axis represents a magnitude of VSWR. Referring to FIG. 6B, the graph 610 shows a relationship between a frequency and a VSWR in the second impedance state. A horizontal axis represents a frequency of a transmission signal, and a vertical axis represents a magnitude of VSWR. The VSWR is defined as in equation (2), and thus a minimum value is 1.

A frequency of a signal of the service frequency band causing interference to a satellite frequency band may be substantially 788 MHz. In the first impedance state, a VSWR of a signal of 788 MHz may be the lowest in a neighboring frequency range (e.g., M3 to M4) of the signal of 788 MHz. That is, in the first impedance state, high transmit power can be output while minimizing a power loss through a low reflection coefficient. On the other hand, in the second impedance state, it can be seen that the VSWR of the signal of about 788 MHz increases compared to the case of the graph 610. That is, the power loss may increase through a high reflection coefficient, compared to the first impedance state.

A graph 620 shows a Smith chart for the first impedance state according to a frequency of a transmission signal. An axis 625 represents a reference line in which a reactance component of impedance is 0. If a point is located above the axis 625, impedance at a corresponding frequency may have an inductive load. On the contrary, if the point is located below the axis 625, the impedance at the corresponding frequency may have a capacitive load. Referring to a point 630, the impedance has a capacitive load in the first impedance state for decreasing the reactance component of the total impedance through impedance matching. However, since the first impedance state is related to a configuration of a tuner for increasing power efficiency of a PA in the service frequency band without considering harmonic interference, the signal of the service frequency band of the electronic device 101 may cause the harmonic interference in the GNSS frequency band (e.g., L1 band).

A graph 670 shows a Smith chart for the second impedance state according to a frequency of a transmission signal. An axis 675 represents a reference line in which a reactance component of impedance is 0. If a point is located above the axis 675, impedance at a corresponding frequency may have an inductive load. On the contrary, if the point is located below the axis 675, the impedance at the corresponding frequency may have a capacitive load.

Referring to the graph 620, since conjugate matching is required for impedance matching and the impedance of the first impedance state is the capacitive load, a characteristic impedance may have an inductive load. In this case, if impedance of a tuner has an inductive load similarly to the point 630, the power efficiency of the PA operating in the service frequency band may be reduced. Since the second impedance state is related to a configuration for removing a harmonic component through the tuner, even if power consumption increases, the electronic device 101 may reduce harmonic interference in the GNSS frequency band by maintaining linearity of an output of the PA in a characteristic impedance region. According to various embodiments, in the second impedance state, value(s) of elements of the tuner may be set such that an RF frequency (e.g., 788 MHz) of an original service band is located at a point (e.g., a point 680) of a position of an inductance region in the Smith chart. According to an embodiment, when an antenna switch is used instead of the tuner, a time constant used to connect the switch and a ground GND may be set to correspond to a value of an inductor of the tuner.

According to various embodiments, the electronic device 101 may change an impedance value of the antenna stage by controlling the elements of the impedance tuner. The electronic device 101 may use antenna tuning to move a secondary harmonic signal such that an impedance value for a radio signal of a 788 MHz band close to the GNSS frequency is located at inductance on the Smith chart, thereby reducing interference caused by harmonics of the radio signal. Since harmonic interference is reduced, GNSS performance (e.g. GNSS reception sensitivity) may be significantly improved.

In various embodiments of the disclosure, not only a notch filter is disposed to a duplexer for harmonic processing in different frequency bands but also the notch filter may be disposed to input and output stages of a PA to more efficiently remove a non-linear component causing harmonics. In addition, in various embodiments of the disclosure, an impedance tuner may be disposed to an antenna state to reduce a harmonic signal which is not removed even if the notch filter is used. The electronic device 101 according to various embodiments may use the notch filter and the tuner to more efficiently remove a caused harmonic component which is closer to another frequency band.

Although the disclosure has described the B14 band as the interference providing band and the GPS L1 band as the interference occurring band for example, various embodiments of the disclosure are not limited thereto. Even in case of not only GPS but also other satellite communication systems and even in case of not only the B14 band but also another frequency band, harmonic processing of the disclosure may be applied when a multiplication component of a specific frequency band at least partially overlaps another frequency band to cause harmonic interference.

Although an expression 'greater than or equal to' or 'less than or equal to' is used in the disclosure to determine whether a specific condition is fulfilled, this is for exemplary purposes only and does not exclude an expression of 'greater than' or 'less than'. A condition described as "greater than or equal to" may be replaced with "greater than". A condition described as "less than or equal to" may be replaced with "less than". A condition described as "greater than or equal to and less than" may be replaced with "greater than and less than or equal to".

Methods based on the embodiments disclosed in the claims and/or specification of the disclosure can be implemented in hardware, software, or a combination of both.

When implemented in software, computer readable recording medium for storing one or more programs (i.e., software modules) can be provided. The one or more programs stored in the computer readable recording medium are configured for execution performed by one or more processors in the electronic device. The one or more programs include instructions for allowing the electronic device to execute the methods based on the embodiments disclosed in the claims and/or specification of the disclosure.

The program (i.e., the software module or software) may be stored in a random access memory, a non-volatile memory including a flash memory, a Read Only Memory (ROM), an Electrically Erasable Programmable Read Only Memory (EEPROM), a magnetic disc storage device, a Compact Disc-ROM (CD-ROM), Digital Versatile Discs (DVDs) or other forms of optical storage devices, and a magnetic cassette. Alternatively, the program may be stored in a memory configured in combination of all or some of these storage media. In addition, the configured memory may be plural in number.

Further, the program may be stored in an attachable storage device capable of accessing the electronic device through a communication network such as the Internet, an Intranet, a Local Area Network (LAN), a Wide LAN (WLAN), or a Storage Area Network (SAN) or a communication network configured by combining the networks. The storage device may have an access to a device for performing an embodiment of the disclosure via an external port. In addition, an additional storage device on a communication network may have an access to the device for performing the embodiment of the disclosure.

In the aforementioned specific embodiments of the disclosure, a component included in the disclosure is expressed in a singular or plural form according to the specific embodiment proposed herein. However, the singular or plural expression is selected properly for a situation proposed for the convenience of explanation, and thus the various embodiments of the disclosure are not limited to a single or a plurality of components. Therefore, a component expressed in a plural form may also be expressed in a singular form, or vice versa.

While the disclosure has been shown and described with reference to certain preferred embodiments thereof, it will be understood by those skilled in the art that various changes in form and details may be made therein without departing from the spirit and scope of the disclosure as defined by the appended claims. Therefore, the scope of the disclosure is defined not by the detailed description thereof but by the appended claims, and all differences within equivalents of the scope will be construed as being included in the disclosure.

The invention claimed is:

1. An electronic device in a wireless communication system, the electronic device comprising:
a processor;
a radio frequency (RF) antenna and a power amplifier (PA) for a first frequency band;
a satellite antenna and a low noise amplifier (LNA) for a second frequency band at least partially overlapping a frequency band which is twice the first frequency band; and
an impedance tuner which is in a first impedance state or a second impedance state under a control of the processor and which is electrically connected to the RF antenna and the PA,
wherein a harmonic output level of the PA in the first impedance state is greater than a harmonic output level of the PA in the second impedance state, and
wherein the processor is configured to:
identify whether a magnitude of harmonic interference against signal sensitivity of the satellite antenna for the second frequency band is less than a threshold;
in case that the magnitude of the harmonic interference against the signal sensitivity of the satellite antenna for the second frequency band is greater than or equal to the threshold, control the impedance tuner to be in the second impedance state such that the magnitude of the harmonic interference is reduced; and
in case that the magnitude of the harmonic interference against the signal sensitivity of the satellite antenna for the second frequency band is less than the threshold, control the impedance tuner to be in the first impedance state such that transmit power of a first signal transmitted via the RF antenna for the first frequency band increases.

2. The electronic device of claim 1, further comprising:
a first notch filter electrically coupled to an input stage of the PA; and
a second notch filter electrically coupled to an output stage of the PA,
wherein the first notch filter and the second notch filter are configured to remove a harmonic component of the first frequency band.

3. The electronic device of claim 2, further comprising:
a duplexer which allows the first signal of the first frequency band to pass,
wherein the RF antenna transmits or receives the first signal of the first frequency band; and
wherein the satellite antenna receives a second signal of the second frequency band.

4. The electronic device of claim 3, further comprising:
a third notch filter coupled to the duplexer,
wherein the third notch filter is configured to remove a harmonic component of the first frequency band.

5. The electronic device of claim 3,
wherein the impedance tuner is electrically coupled to the RF antenna, and
wherein first reception sensitivity of the satellite antenna related to the first impedance state is lower than second reception sensitivity of the satellite antenna related to the second impedance state.

6. The electronic device of claim 3,
wherein the impedance tuner comprises a first filter portion electrically coupled to the duplexer and a second filter portion electrically coupled to the RF antenna,
wherein the first filter portion comprises a first capacitor and a first inductor,
wherein the second filter portion comprises a second capacitor and a second inductor,
wherein the first capacitor is electrically coupled to the duplexer at a first node between the PA and the first inductor,
wherein the second capacitor is electrically coupled to the RF antenna at a second node between the second inductor and the RF antenna, and
wherein the first inductor and the second inductor are electrically coupled in series between the PA and the RF antenna.

7. The electronic device of claim 6, wherein each of the first inductor and the second inductor is an element providing a fixed value, and
wherein the first capacitor and the second capacitor are each a variable element.

8. The electronic device of claim 7, wherein, to control the impedance tuner to be in the first impedance state, the processor is configured to:
identify a first capacitance value and a second capacitance value corresponding to the first impedance state; and
set the impedance tuner such that the first capacitor has the first capacitance value, and the second capacitor has the second capacitance value, and
wherein, to control the impedance tuner to be in the second impedance state, the processor is configured to:
identify a third capacitance value and a fourth capacitance value corresponding to the second impedance state; and
set the impedance tuner such that the first capacitor has the third capacitance value, and the second capacitor has the fourth capacitance value.

9. The electronic device of claim 1, further comprising a memory which stores information on a plurality of impedance states comprising the first impedance state and the second impedance state,
wherein the processor is further configured to:
identify a communication state, based on an extent to which a harmonic component of the first frequency band affects the second frequency band;
identify an impedance state corresponding to the identified communication state among the plurality of impedance states; and
configure the impedance tuner according to the identified impedance state.

10. The electronic device of claim 1,
wherein the first frequency band is a B14 band (or an LTE Band 14), and
wherein the second frequency band is a global positioning system (GPS) L1 band.

11. A method of operating an electronic device in a wireless communication system, the method comprising:
identifying whether a magnitude of harmonic interference against signal sensitivity of a satellite antenna for a second frequency band is less than a threshold,
in case that the magnitude of the harmonic interference against the signal sensitivity of the satellite antenna for the second frequency band is less than the threshold, configuring an impedance tuner to be in a first impedance state such that transmit power of a first signal transmitted via a radio frequency (RF) antenna for a first frequency band increases; and
in case that the magnitude of the harmonic interference against the signal sensitivity of the satellite antenna for the second frequency band is greater than or equal to the threshold, configuring the impedance tuner to be in a second impedance state such that the magnitude of the harmonic interference is reduced,
wherein the second frequency band at least partially overlaps a frequency band which is twice the first frequency band, and
wherein a harmonic output level of a Power amplifier (PA) operating in the first frequency band in the first impedance state is greater than a harmonic output level of the PA in the second impedance state.

12. The method of claim 11, further comprising
removing a harmonic component of the first frequency band by using a first notch filter electrically coupled to an input stage of the PA and a second notch filter electrically coupled to an output stage of the PA.

13. The method of claim 12, further comprising:
using a duplexer to allow the first signal of the first frequency band to pass;
using the RF antenna to transmit or receive the first signal of the first frequency band; and
using the satellite antenna to receive a second signal of the second frequency band.

14. The method of claim 13, further comprising
using a third notch filter coupled to the duplexer to remove a harmonic component of the frequency band.

15. The method of claim 13,
wherein the impedance tuner is electrically coupled to the RF antenna, and
wherein first reception sensitivity of the satellite antenna related to the first impedance state is lower than second reception sensitivity of the satellite antenna related to the second impedance state.

16. The method of claim 13,
wherein the impedance tuner comprises a first filter portion electrically coupled to the duplexer and a second filter portion electrically coupled to the RF antenna,
wherein the first filter portion comprises a first capacitor and a first inductor,
wherein the second filter portion comprises a second capacitor and a second inductor,
wherein the first capacitor is electrically coupled to the duplexer at a first node between the PA and the first inductor, wherein the second capacitor is electrically coupled to the RF antenna at a second node between the second inductor and the RF antenna, and wherein the first inductor and the second inductor are electrically coupled in series between the PA and the RF antenna.

17. The method of claim 11, further comprising:

using a memory to store information on a plurality of impedance states comprising the first impedance state and the second impedance state;

identifying a communication state, based on an extent to which a harmonic component of the first frequency band affects the second frequency band;

identifying an impedance state corresponding to the identified communication state among the plurality of impedance states; and configuring the impedance tuner according to the identified impedance state.

18. The method of claim 16, wherein each of the first inductor and the second inductor is an element providing a fixed value, and wherein the first capacitor and the second capacitor are each a variable element.

19. The method of claim 18, wherein configuring the impedance tuner to be in the first impedance state comprises:

identifying a first capacitance value and a second capacitance value corresponding to the first impedance state; and setting the impedance tuner such that the first capacitor has the first capacitance value, and the second capacitor has the second capacitance value, and wherein configuring the impedance tuner to be in the second impedance state comprises:

identifying a third capacitance value and a fourth capacitance value corresponding to the second impedance state; and setting the impedance tuner such that the first capacitor has the third capacitance value, and the second capacitor has the fourth capacitance value.

20. The method of claim 11, wherein the first frequency band is a B14 band (or an LTE Band 14), and wherein the second frequency band is a global positioning system (GPS) L1 band.

\* \* \* \* \*